US010080315B2

(12) United States Patent
Agostini et al.

(10) Patent No.: US 10,080,315 B2
(45) Date of Patent: Sep. 18, 2018

(54) COOLING DEVICE AND METHOD FOR COOLING AT LEAST TWO POWER ELECTRONIC DEVICES

(71) Applicant: ABB Schweiz AG, Baden (CH)

(72) Inventors: Francesco Agostini, Zürich (CH); Daniele Torresin, Birmenstorf (CH); Mathieu Habert, Rixheim (FR); Bruno Agostini, Zürich (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/275,428

(22) Filed: Sep. 25, 2016

(65) Prior Publication Data

US 2017/0094843 A1    Mar. 30, 2017

(30) Foreign Application Priority Data

Sep. 24, 2015   (EP) .................................... 15186625

(51) Int. Cl.
*H05K 7/20*      (2006.01)
*F28F 13/10*     (2006.01)
(Continued)

(52) U.S. Cl.
CPC ........ *H05K 7/20936* (2013.01); *F28D 15/025* (2013.01); *F28D 15/0266* (2013.01);
(Continued)

(58) Field of Classification Search
CPC ............. F28D 15/0266; F28D 15/0233; F28D 15/0275; F28D 15/043; F28D 15/02;
(Continued)

(56) References Cited

U.S. PATENT DOCUMENTS 8,405,992 B2 *  3/2013  Yesin ..................... H01L 23/427
                                                165/104.33
8,714,302 B2 *  5/2014  Gradinger .......... H05K 7/20936
                                                165/104.33
(Continued)

FOREIGN PATENT DOCUMENTS

EP          2031332 A1     4/2009
EP          2645040 A1    10/2013
(Continued)

OTHER PUBLICATIONS

European Patent Office, Extended Search Report issued in corresponding Application No. 15186625.8, dated Apr. 14, 2016, 8 pp.

*Primary Examiner* — Adam B Dravininkas
(74) *Attorney, Agent, or Firm* — J. Bruce Schelkopf; Taft Stettinius & Hollister LLP

(57) ABSTRACT

A cooling device for cooling at least two power electronic devices by a working fluid. The cooling device has a heat receiver portion of the Pulsating Heat Pipe circuit system and a pair of thermo-conducting walls provided on mutually opposite sides of the heat receiver arrangement and sandwiching the heat receiver portion between them. These walls are adapted for being thermally connected to a respective one of the power electronic devices. The cooling device further has a heat dissipator arrangement with a heat dissipator portion of the Pulsating Heat Pipe circuit system and a plurality of fins thermally coupled to the heat dissipator portion for transferring heat from the heat dissipator portion to an external cooling fluid for cooling the working fluid in the heat dissipator portion. The Pulsating Heat Pipe circuit system connects the heat receiver portion with the heat dissipator portion for transferring heat from the heat receiver portion to the heat dissipator portion by the Pulsating Heat Pipe action of the working fluid.

23 Claims, 5 Drawing Sheets

(51) Int. Cl.
*F28F 9/02* (2006.01)
*F28D 15/02* (2006.01)

(52) U.S. Cl.
CPC ........ *F28D 15/0275* (2013.01); *F28F 9/0278* (2013.01); *F28F 13/10* (2013.01); *H05K 7/209* (2013.01)

(58) Field of Classification Search
CPC ..... F28D 15/04; F28D 15/025; H01L 23/427; H05K 7/20336; H05K 1/0203; H05K 7/20681; H05K 7/20309; H05K 7/20318; H05K 7/20672; H05K 7/20936; H05K 7/209; F28F 13/10; F28F 9/027
See application file for complete search history.

(56) References Cited

U.S. PATENT DOCUMENTS

| | | | | |
|---|---|---|---|---|
| 2001/0023757 | A1* | 9/2001 | Huang | F28D 15/0266 165/104.26 |
| 2001/0033477 | A1* | 10/2001 | Inoue | H01L 23/4006 361/718 |
| 2006/0146496 | A1* | 7/2006 | Asfia | H05K 7/20672 361/700 |
| 2006/0284308 | A1* | 12/2006 | Harada | H01L 25/072 257/729 |
| 2008/0087406 | A1* | 4/2008 | Asfia | F28D 15/0233 165/104.29 |
| 2009/0056916 | A1* | 3/2009 | Yesin | F28D 1/05383 165/104.21 |
| 2009/0101308 | A1* | 4/2009 | Hardesty | F28D 1/035 165/80.4 |
| 2009/0116192 | A1* | 5/2009 | McCullough | F28D 15/0266 361/701 |
| 2009/0323276 | A1* | 12/2009 | Mongia | G06F 1/203 361/679.52 |
| 2010/0315781 | A1* | 12/2010 | Agostini | F28D 15/0233 361/700 |
| 2012/0250380 | A1* | 10/2012 | Ichijyo | H05K 7/20927 363/123 |
| 2013/0077245 | A1* | 3/2013 | Gradinger | F28D 1/035 361/700 |
| 2015/0060019 | A1* | 3/2015 | Tseng | F28D 15/025 165/104.25 |
| 2015/0323261 | A1* | 11/2015 | Tseng | F28D 15/0233 165/104.22 |

FOREIGN PATENT DOCUMENTS

| | | |
|---|---|---|
| EP | 2793261 A1 | 10/2014 |
| EP | 2857783 A1 | 4/2015 |
| WO | 2011035943 A2 | 3/2011 |

* cited by examiner

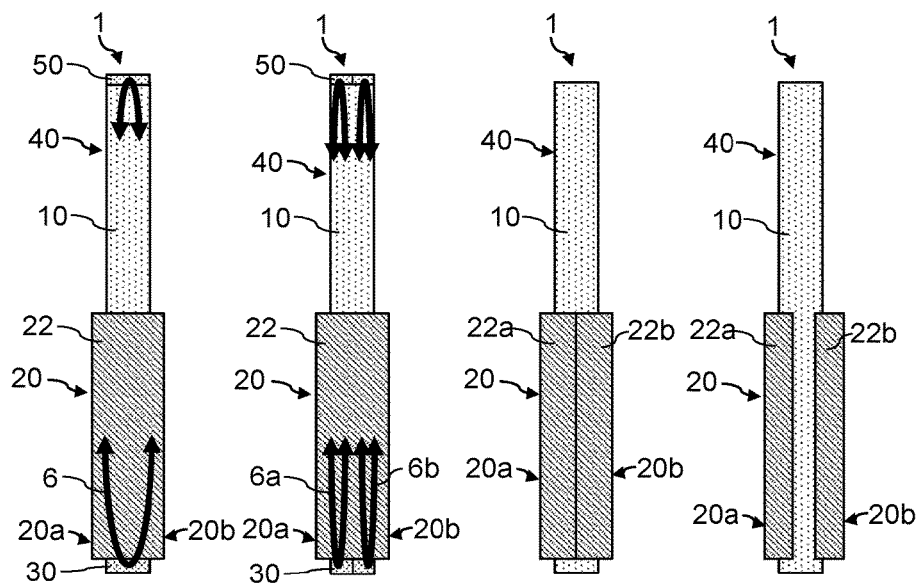
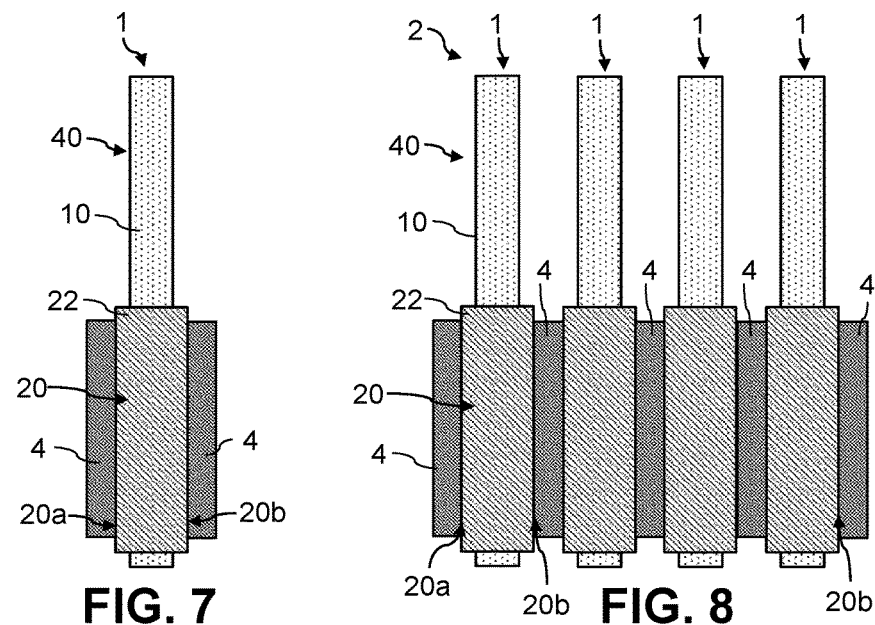

COOLING DEVICE AND METHOD FOR COOLING AT LEAST TWO POWER ELECTRONIC DEVICES

The present invention relates to a cooling device for cooling at least two power electronic devices by a working fluid. In particular, the invention relates to a cooling device having a Pulsating Heat Pipe circuit system in which the working fluid is transported by Pulsating Heat Pipe action.

TECHNICAL BACKGROUND

Due to the on-going miniaturization of electrical components and the general advancement of technology, the thermal management of high heat fluxes is becoming a pivotal requirement for power electronic devices. Although conventional heat pipes have proved to be effective for cooling, their functionality at very high heat fluxes is limited by their form factor and operational limits.

These limitations have been partially overcome by a different cooler type, the pulsating heat pipe (PHP), introduced by Akachi et al. (Akachi H., Polàšek F. and Štulc P., Pulsating Heat Pipes, Proc. 5th Int. Heat Pipe Symp., Melbourne, 1996, 208-217) and described in EP 2 444 770 A1. The pulsating heat pipe has, as a basic structure, a Pulsating Heat Pipe circuit system with a different tube geometry than a conventional heat pipe, reflecting the fundamentally different transport principle for the working fluid, to be described in more detail below.

However, even when cooling is performed by a pulsating heat pipe-based cooling device, there remains a need to obtain still higher power densities and a more compact configuration.

SUMMARY OF THE INVENTION

In view of the above, a cooling device for cooling at least two power electronic devices according to claim 1, a power electronic arrangement according to claim 8, a use according to claim 11, and a method for cooling at least two power electronic devices according to claim 12 are provided. Further possible aspects of the invention are evident from the dependent claims, the following description and the Figures.

Thus, aspects of the invention allow mounting of at least two power electronic devices, one on each side of the cooling device's heat receiver arrangement, thereby allowing to cool the at least two power electronic devices simultaneously. Thereby, increased cooling power density and/or compact configuration can be achieved while cost may be lowered. Also, embodiments of the invention allow, by the shared cooling of multiple power electronic devices, temperature inhomogeneities to be leveled out efficiently. Embodiments of the invention are particularly suited for series-connected power electronic devices.

BRIEF DESCRIPTION OF THE FIGURES

Aspects and embodiments of the invention are described in the following in more detail with reference to the Figures, in which

FIG. 5A shows a schematic side view of a cooling device with the Pulsating Heat Pipe circuit system forming a common interconnected loop for both thermo-conducting walls;

FIG. 5B shows a schematic side view of a cooling device with the Pulsating Heat Pipe circuit system forming independent loops for each thermo-conducting wall;

FIGS. 6A and 6B show schematic side views of a cooling device with the pair of thermo-conducting walls being arranged on metal blocks contacting each other and not contacting each other, respectively;

FIG. 7 shows a schematic side view of a power electronic arrangement in which two power electronic devices are cooled by a cooling device; and FIG. 8 shows a schematic side view of a power electronic arrangement in which power electronic devices and cooling devices are stacked in an alternating order.

DETAILED DESCRIPTION

Figure 1A:
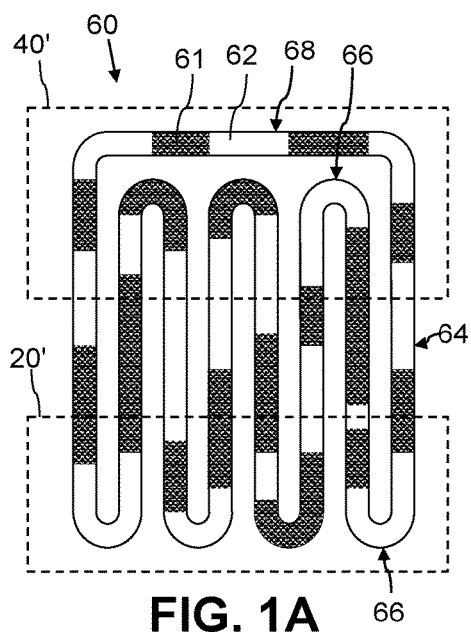
FIGS. 1A-1D show schematic side views of different examples of Pulsating Heat Pipe circuit systems which may be used according to aspects of the invention.

In the following, various aspects and embodiments of the invention are described. It is intended that each of the aspects, whether described in the context of a particular embodiment or of other features or not, can be combined with any other aspect.

In the Figures and the following description, the same reference numbers are used for analogous elements, and the description of any embodiment relating to the same reference sign is applicable to any other embodiment unless mentioned otherwise and/or unless the description would be inconsistent with that embodiment.

Pulsating Heat Pipe

First, some aspects relating to the Pulsating Heat Pipe (PHP) will be described. Examples of Pulsating Heat Pipe circuit systems 60 are shown in FIGS. 1A-1D, and in the following the reference numbers of these Figures are referred to even though general aspects of the Pulsating Heat Pipe are described.

The Pulsating Heat Pipe has a Pulsating Heat Pipe circuit system 60 having tubes of capillary dimension and containing a working fluid forming liquid-vapor plugs 61 and slugs 62. The liquid-vapor plugs 61 and slugs 62 can be obtained by evacuating the tube circuit system 60 and then filling it partially with the working fluid. Due to the tubes having a diameter of capillary dimensions, the fluid distributes itself naturally into the liquid-vapor plugs 61 and slugs 62.

During operation, one portion (heat receiver portion) 20' of the tube circuit system 60 receives heat, and the working fluid transfers the heat by a pulsating action of the liquid-vapor system to another portion (heat dissipator portion) 40' at which the heat is taken out.

This pulsating action, also referred as Pulsating Heat Pipe action, is a non-equilibrium chaotic process creating large pressure fluctuations under which the liquid-vapor plugs 61 and slugs 62 are transported back and forth in the tube circuit system. The non-equilibrium conditions required for this process are created by the temperature difference between the heat receiver portion 20' and the heat dissipator portion 40'. Other than this, no external power source is needed to either initiate or sustain the Pulsating Heat Pipe action. Hence, according to an aspect of the invention, the cooling device is passive, i.e., does not comprise any active component such as a pump for the working fluid.

The Pulsating Heat Pipe is fundamentally different from conventional thermosyphons. One difference is that the tubes of the Pulsating Heat Pipe circuit system 60 are of (preferably throughout) capillary dimensions, whereby the liquid-vapor plugs 61 and slugs 62 and the Pulsating Heat Pipe action are maintained. In particular, there is no larger-volume reservoir for the working fluid, i.e., a reservoir of a volume that would act as a pressure reservoir and that would thereby interfere with the Pulsating Heat Pipe action.

Pulsating Heat Pipes share some of the advantages of conventional thermosyphons, such as the passivity and reliability; but in addition they offer some particular advantages due to their unique geometry and thermofluidic transport mechanism:

- There is essentially no pre-defined or preferred flow direction of the working fluid; instead chaotic movement in both directions; this may result in a more uniform cooling;
- The Pulsating Heat Pipe action is independent of gravity, and as a result the Pulsating Heat Pipe is operable in any orientation;
- Low manufacturing complexities and only few geometrical constraints resulting in low cost;
- High heat load, and correspondingly improved compactness and/or cooling performance.

Tube Geometry:

As stated above, the tubes of the Pulsating Heat Pipe circuit system 60 are of (preferably throughout) capillary dimensions. Herein, a capillary dimensions is defined by a diameter of the tube in a cross-sectional plane perpendicular to a tube axial direction. According to a preferred aspect, the diameter is a hydraulic diameter, but the diameter can also be given as the cross-sectional geometric diameter (smallest cross-sectional diameter through the tube center). According to a preferred aspect, the diameter is smaller than 5 mm, preferably smaller than 3 mm, 2 mm or even smaller than 1 mm. These diameters are of the order of capillary dimensions for typical working fluids in typical operating conditions.

According to another aspect, the diameter is smaller than a critical diameter defined by the working fluid. In more detail, Pulsating Heat Pipes operate in a regime in which surface tension forces of the working fluid are dominant. The critical diameter is defined by the condition that the diameter of the tubes is to be so small (capillary) that the surface tension forces dominate gravitational forces. This is the case if the tube diameter is smaller than the diameter Dcrit, or a small multiple thereof, Dcrit being given as $$D_{crit} = 2\sqrt{\frac{\sigma_{LV}}{(g(\rho_L - \rho_V))}}$$

where $\rho_L$ and $\rho_V$ are the liquid and vapor densities respectively, $\sigma_{LV}$ is the fluid surface tension of the working fluid. These values are taken at the operating conditions of the working fluid (typically, at saturation temperature).

If D<Dcrit surface tension forces tend to dominate and stable liquid slugs are formed as shown in FIGS. 1A-1D, enabling Pulsating Heat Pipe action. On the other hand, if the tube diameter increases significantly above Dcrit or small multiples thereof, the surface tension is reduced and all the working fluid tends to stratify by gravity and the heat pipe will not work as a Pulsating Heat Pipe. It was found that the pumping effect under certain conditions (non-adiabatic, flow boiling conditions) was possible for diameter up to 10 times Dcrit, but that lower diameters lead to a more efficient Pulsating Heat Pipe action.

Hence, according to a particular aspect, the tube diameter is smaller than 10*Dcrit, preferably smaller than 5*Dcrit, more preferably smaller than 2*Dcrit, and particularly preferably smaller than Dcrit as defined above.

According to an aspect, at least one of the following working fluids may be used: Water, ethanol, R134a, R245fa, R1233zd, R1234yf, R1234ze, or mixtures thereof.

According to an aspect the cooling device/Pulsating Heat Pipe circuit system does not include any large-volume reservoir for the working fluid, of a volume that would act as a pressure reservoir and that would interfere with the Pulsating Heat Pipe action. Thus, according to an aspect, the tube diameter of the tube circuit system does not exceed the above-defined capillary dimensions for the working fluid throughout the tube circuit system.

FIGS. 1A-1D show schematic side views of different examples of Pulsating Heat Pipe circuit systems which may be used according to aspects of the invention. FIG. 1A shows a closed-loop serpentine configuration with multiple straight tube elements 64 joined at their ends by joining sections 66 to form a serpentine having several turns at each (top and bottom) side. Due to the serpentine geometry with the plurality of turns at each side, the tubes meander back and forth between the heat receiver portion 20' and heat dissipator portion 40'. In addition, the ends of the tubes are joined by an end-to-end joining section 68, which is part of the heat dissipator portion 40', to form the closed loop.

Figure 1B:
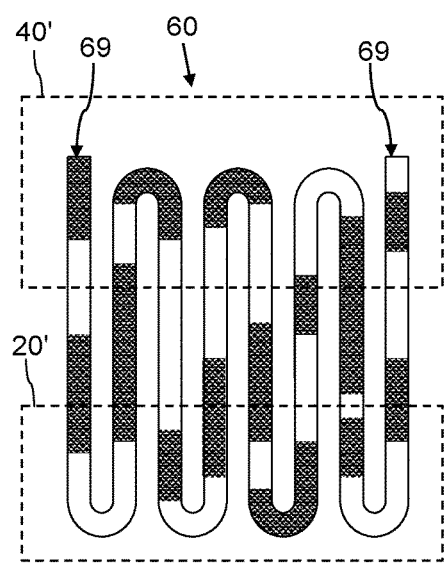

FIG. 1B shows an alternative configuration in which the end-to-end joining section 68 is omitted, so that an open loop serpentine configuration with ends 69 is formed instead of the closed-loop configuration of FIG. 1A.

Figure 1C:
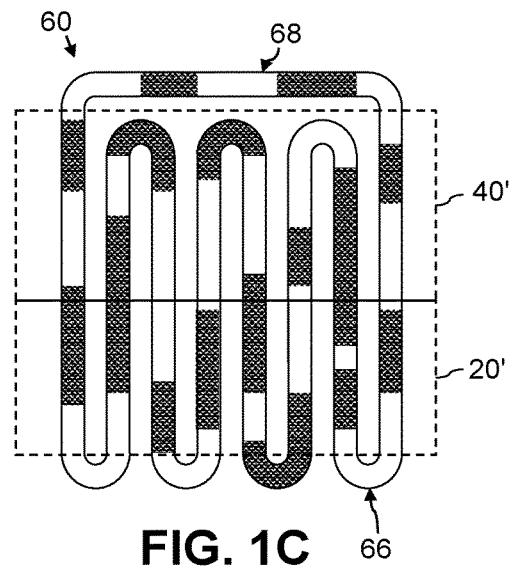

FIG. 1C corresponds to FIG. 1A, but illustrates the general aspect that the heat receiver portion 20' may be directly adjacent to the heat dissipator portion 40', leading to an even more compact design. The end-to-end joining section 68 may or may not be part of the heat receiver portion 20' (or the heat dissipator portion 40'). FIG. 1C shows an example in which the end-to-end joining section 68 is adjacent to, but not part of the heat receiver portion 20'.

Figure 1D:
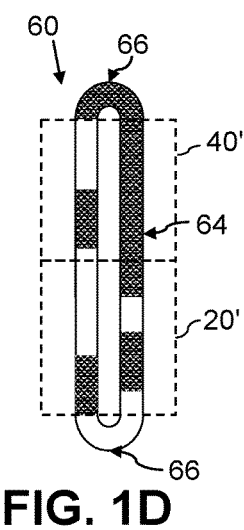

The number of serpentines of the tube geometry may be varied. FIG. 1D shows an example with the minimum number of only one serpentine (=a circuit system portion going from portion 20 to 40 and back, or vice versa, thus having only one turn at each side) meandering back and forth between the heat receiver portion 20' and heat dissipator portion 40'.

According to a preferred aspect, the tube circuit system comprises at least two serpentines, and preferably at least 10 serpentines, wherein the number of serpentines corresponds to the number of turns at each side.

According to a general aspect, the tube circuit system comprises straight segments which overlap with both the heat receiver portion 20' and the heat dissipator portion 40', and at least some of which are joined directly to each other at their ends by (channel-like/small-diameter) joining sections.

Figure 2A:
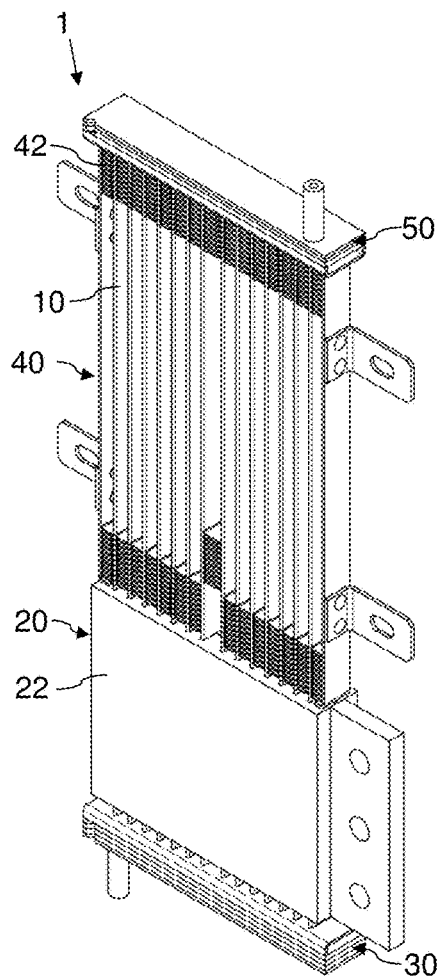
FIGS. 2A-2C show a cooling device according to an embodiment of the invention in perspective view, frontal view and horizontal cross-sectional view, respectively.
Figure 2B:
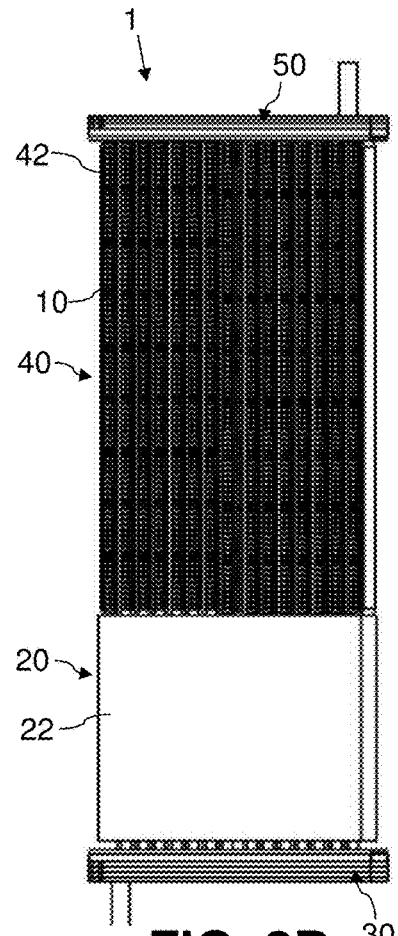
Figure 2C:
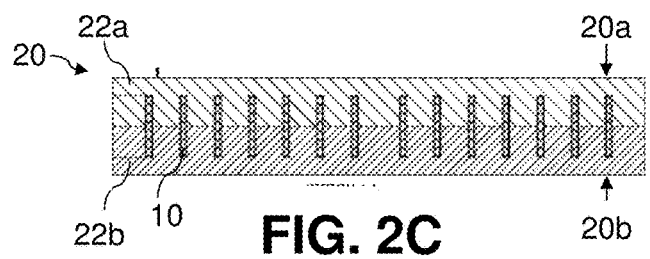

Cooling Device Design Using Multitube Elements as Shown in FIG. 2A-2C

In the following, the cooling device 1 shown in FIGS. 2A-2C is described in more detail. Herein, FIG. 2A shows the cooling device in a perspective view; FIG. 2B shows a frontal view, and FIG. 2C shows a horizontal cross-sectional view through the heat receiver arrangement.

The cooling device 1 comprises a plurality of multitube elements 10 (multiport extruded tubes) extending in a vertical direction, each multitube element 10 having multiple parallel straight capillary tubes extending in a lengthwise direction, as shown in FIG. 2C. At a bottom (heat receiver portion side) end and at a top (heat dissipator portion side) end of the multitube elements 10, a first connecting manifold 30 and a second connecting manifold 50 are respectively provided. These first and second connecting manifolds 30, 50 provide connecting passageways connecting the end portions of the capillary tubes with each other in a selective manner, as is described in more detail below. Thereby, the tubes of the multitube elements 10 and the connecting passageways of the first and the second connecting manifolds 30, 50 form loop(s) of the Pulsating Heat Pipe circuit system. Herein, a circuit system is defined as the set of all tubes and other passageways for the working fluid, and a loop is a subset of the circuit system whose parts are all fluidly interconnected with each other. The Pulsating Heat Pipe circuit system thus may have one interconnected loop (if all parts of the circuit system are interconnected with each other as shown in FIG. 5A) or more than one loop (if the circuit system has several loops that are not interconnected with each other as shown in FIG. 5B). As a result, the circuit system operates like two independent coolers but has smaller footprint.

The cooling device 1 of FIGS. 2A-2C further comprises a heat receiver arrangement 20. The heat receiver arrangement 20 comprises a metal block 22 with openings accommodating the multitube elements 10, so that portions of the multitube elements 10 extend through these openings. The inserted portion of the tubes of the multitube elements 10 are also referred to as the heat receiver portion of the Pulsating Heat Pipe circuit system. The metal block 22 further has a pair of thermo-conducting walls 20a, 20b on opposite sides, which are adapted for receiving at least one power electronic device each. The configuration with attached power electronic devices 4 is shown in FIG. 7.

The metal block 22 includes the pair of thermo-conducting walls 20a, 20b and extends to the multitube elements 10, thereby providing a thermal coupling between the thermo-conducting walls 20a, 20b and the multitube elements 10. Thereby, in an operating state heat is transferred from the power electronic devices 4 through the respective thermo-conducting walls 20a, 20b to the heat receiver portion thereby heating the working fluid.

By the simultaneous cooling of two power electronic devices sandwiching the heat receiver arrangement 20, a compact configuration and high cooling density can be achieved. Furthermore, the metal block 22 provides for an efficient heat transfer to the multiport elements 10 and thereby ensures high cooling performance.

Directly adjacent to (above) the heat receiver arrangement 20 is a heat dissipator arrangement 40 having fins 42 thermally coupled (e.g., soldered or brazed) to the multitube elements 10. The corresponding portion (portion with fins attached) of the Pulsating Heat Pipe circuit system is also referred to as the heat dissipator portion. The fins allow heat transfer from the heat dissipator portion to an external cooling fluid, such as cooling air flowing through the fins, for cooling the working fluid in the heat dissipator portion.

The tubes of the multitube elements 10 connect the heat receiver arrangement 20 and the heat dissipator arrangement 40 by Pulsating Heat Pipe action of the working fluid. Thus, during operation heat is transferred from the power electronic devices arranged on both opposite side of the heat receiver arrangement 20, through the thermo-conducting walls 20a, 20b and the metal block 22, to the working fluid in the heat receiver portion of the tubes of the multitube elements 10, thereby heating the working fluid. This heat is then transported by Pulsating Heat Pipe action to the heat dissipator arrangement 40, from where the heat is transferred via the fins 42 to the environment (air or another external cooling fluid).

Although the above description has been made with reference to FIGS. 2A-2C, described aspects are not limited to these Figures but illustrate more general aspects. In the following, some such general aspects are mentioned. According to one aspect, the cooling device comprises a plurality of multitube elements 10, each having multiple parallel straight capillary tubes along a lengthwise direction. Preferably, the tubes of the multitube elements are connected in a selective manner at their both ends with each other. According to a further aspect, each multitube element comprises 3 tubes or more, preferably between 4 and 12 tubes. According to another aspect, each multitube element comprises an even number of tubes. According to a further aspect, the heat receiver section is directly adjacent to the heat dissipator section.

According to a further aspect, the multitube elements are extruded and/or are made of metal, the metal preferably being aluminum or an aluminum alloy. According to a further aspect, the multitube elements extend with their length direction (parallel to the extension of the straight tubes) in a Z direction, and are oriented so that the tubes are aligned along a Y direction, and the multitube elements are aligned along an X direction, wherein the X, Y and Z directions are orthogonal to each other.

According to a further aspect, illustrated in FIG. 2C, the heat receiver arrangement 20 or even the entire cooling device is essentially symmetric (i.e., symmetric at least with respect to the parts mentioned claim 1 and optionally in the dependent claims) with respect to a central symmetry plane inbetween the thermo-conducting walls 20a, 20b. According to a further aspect, the distance between the thermo-conducting wall 20a and/or 20b and its closest tube is smaller than the extension of the multitube element 10 in lateral direction orthogonal to the thermo-conducting walls 20a, 20b, and is preferably even smaller than half that length.

Connecting Manifolds

Figure 3:
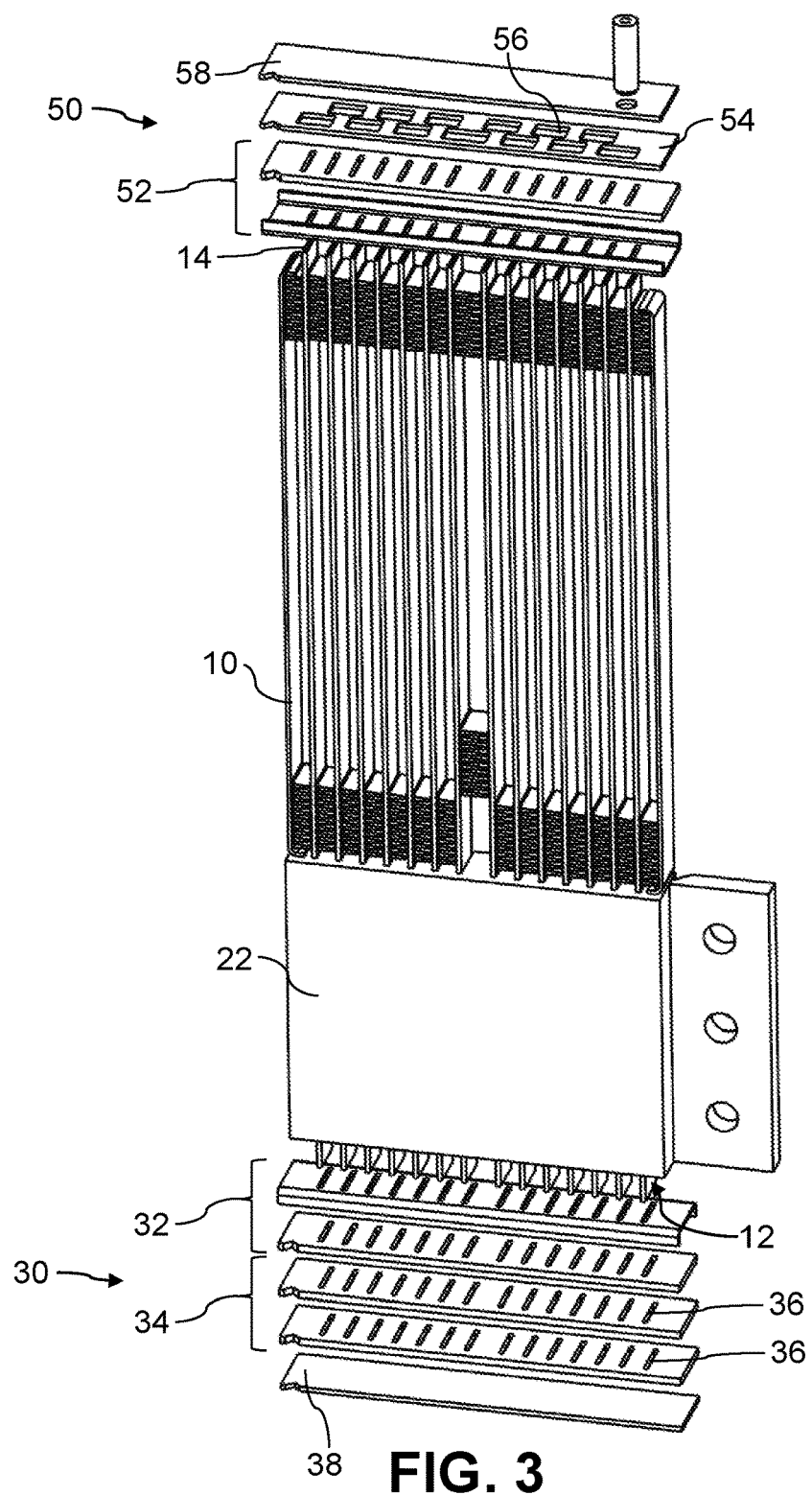
FIG. 3 shows the cooling device of FIGS. 2A-2C, including its top and bottom connecting manifold in an exploded view.

With reference to FIG. 3, the first and second connecting manifolds 30, 50 are now described in more detail. The second connecting manifold 50 is provided at a top (heat dissipator portion side) end 14 of the multitube elements 10 and comprises a fluid distribution plate 54 with fluid distribution openings 56. The fluid distribution plate 54 is sandwiched between a multitube-side sealing plate 52 and an outer sealing plate 58. The multitube-side sealing plate 52 has openings through which the ends of the tubes are exposed to the fluid distribution plate 54. Otherwise, the multitube-side sealing plate 52 and an outer sealing plate seal the fluid distribution openings 56, so that the fluid distribution openings 56 form connecting passages which connect ends of the tubes to each other in a selective manner, but which are otherwise sealed from the outside.

The first connecting manifold 30 is constructed in a likewise manner: The first connecting manifold 30 is provided at a bottom (heat receiver portion side) end 12 and at a top (heat dissipator portion side) end 14 of the multitube elements 10 and comprises a fluid distribution plate 34 with fluid distribution openings 36. In FIG. 3, the fluid distribution plate 34 is made of several sub-plates 34, but it can alternatively also be a single combined plate. The fluid distribution plate 34 is sandwiched between a multitube-side sealing plate 32 and an outer sealing plate 38. The multitube-side sealing plate 32 has openings through which the ends of the tubes are exposed to the fluid distribution plate 34. Otherwise, the multitube-side sealing plate 32 and outer sealing plate 38 seal the fluid distribution openings 36, so that the fluid distribution openings 36 form connecting passages which connect ends of the tubes to each other in a selective manner, but which are otherwise sealed from the outside.

Figure 4A:
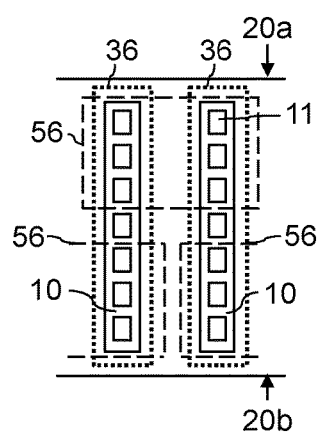
FIGS. 4A-4C show schematic horizontal cross-sectional views illustrating possible alternative configurations for the top and bottom connecting manifolds.
Figure 4B:
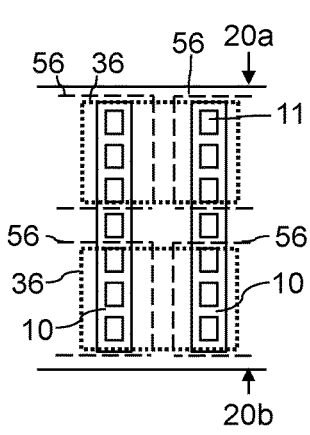
Figure 4C:
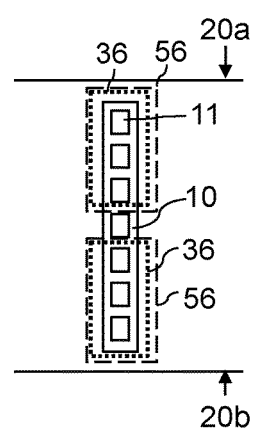

The fluid distribution openings 56 (dashed lines) and 36 (dotted lines) are also shown in the schematic top view of FIG. 4A, along with the ends of the multitube elements 10 and the ends of the tubes 11 provided therein.

With reference to FIGS. 3 and 4A, some possible general aspects of the first and second connecting manifolds 30, 50 and of the first and second connecting passages—defined by the fluid distribution openings 36, 56 and assigned the same reference signs—will now be described: According to an aspect, the first connecting passages 36 may connect capillary tubes of the same multitube element only, or may also interconnect capillary tubes of the different multitube elements among each other. Likewise, the second connecting passages 56 may connect capillary tubes of the same multitube element only, or may also interconnect capillary tubes of different multitube elements among each other. It is preferred, however, that one of the first and second connecting passages 36, 56 connects capillary tubes of different multitube elements among each other, and the other one connects capillary tubes of the same multitube element only.

According to a further aspect, the first and/or second connecting manifold 30, 50 is constituted by a plurality of plates extending in a direction orthogonal to the tube axis defined by the multitube elements.

According to a further aspect, the second connecting passages 56 connect tube ends of different (e.g., neighbouring) multitube elements with each other. According to a further aspect, they do not connect all tube ends of one and the same multitube element with each other. According to a further aspect, the second connecting passages 56 are arranged in two rows connecting neighbouring multitube elements in a staggered manner with respect to each other. According to a further aspect, a first subset of the second connecting passages 56 provides fluid passageways interconnecting a first subset of ends of tubes being proximate to the first thermoconducting wall 20a, and a second subset of the second connecting passages 56 provides fluid passageways interconnecting a second subset of ends of tubes being proximate to the second thermoconducting wall 20b, wherein the second connecting passages 56 do not provide any connection between the first and second subset of tubes. According to a further aspect, the first connecting passages 36 provide a connection between the first and second subset of tubes, preferably a connection within respective multitube elements but not interconnecting tube ends of different multitube elements. According to a further aspect, the first and second connecting passages 36, 56 provide a single connected circuit system in which each tube of the circuit system is connected to each other tube of the circuit system.

Thus, the fluid passageways 56 connect a first group of tubes from a given multitube element 10 with a corresponding first group of tubes of an adjacent multitube element, while not providing a connection with the tubes of a second group of tubes of the given multitube element 10. The fluid passageways 36, on the other hand, connect the first group of tubes of a given multitube element 10 with another, second group of tubes of the same multitube element, while not providing a connection with tubes of another adjacent multitube element 10.

According to a further aspect, the fluid passageways 36, 56 have a thickness (in a direction of the tube axis of the multitube elements) of less than a capillary dimension as defined above, and/or of less than twice a diameter of the tubes of the multitube elements.

One-Loop, Two-Loop Configuration:

As shown above, the fluid passageways 36 of the connecting manifold 30 shown in FIGS. 3 and 4A interconnect all tubes of a given multitube element 10. Thereby, the entire Pulsating Heat Pipe circuit system forms a single common loop which is in close thermal contact with both thermoconducting surfaces 20a and 20b (has loop sections proximate to each thermoconducting wall 20a/20b, respectively).

This concept is further illustrated in FIG. 5A in which the common interconnected loop 6 is indicated schematically. The Figure illustrates the general aspect that the common interconnected loop 6 has a first loop section proximate (in close proximity) to thermo-conducting wall 20a, and a second loop section proximate (in close proximity) to the other thermo-conducting wall 20b. Hereby, "proximate" is defined as including the tube which is closest to the respective thermoconducting wall 20a/20b (e.g. closest tube of each or at least some of the multitube elements), and/or a tube that is closer than ¼ of the width of the heat receiver arrangement to the respective thermoconducting wall 20a/20b, with a metal or other good thermoconductor inbetween.

The common interconnected loop thus balances or reduces any heat differences between the pair of thermoconducting walls 20a, 20b, and thereby allows reducing thermal imbalances between the power electronic devices attached to the pair of thermo-conducting walls 20a, 20b. The arrangement of FIG. 5A is thus beneficial if thermal differences on both sides of the cooling device should be balanced. This arrangement is particularly suited to a configuration in which thermally similar power electronic devices, i.e., power electronic devices with the same heat losses (e.g., of the same type) are used on thermo-conducting walls 20a and 20b.

This advantage would not be achieved by merely putting two coolers in back to back configuration, which arrangement may not only be more space-consuming but also lead to thermal imbalances between both sides, as well as possibly to thermal stacking. Based on such a back-to-back configuration, it might have been attempted to mitigate these thermal imbalances by connecting both coolers by means of a pipe. However, an ordinary pipe would inhibit the pressure pulsation and thereby hinder the Pulsating Heat Pipe action. An advantage of the configuration of FIG. 5A is therefore that the thermal imbalances are reduced while the single cooling device with a dedicated common interconnected circuit system structure allows maintaining the Pulsating Heat Pipe action and its remarkably high thermal transport performance.

In FIG. 5A, the common interconnected loop is achieved by having the first connecting manifold 30 and the second connecting manifold 50 both provide fluid passageways that interconnect all tubes of the multitube element 10 with each other. As shown in FIG. 3, it is alternatively sufficient if only one of the connecting manifolds 30, 50 provides fluid passageways that interconnect all tubes of the multitube element 10 with each other. In a further variation, none of the connecting manifolds 30, 50 need to interconnect all tubes with each other, as long as their combined fluid passageways interconnect all tubes of the multitube element 10 with each other.

In contrast, FIG. 5B illustrates an alternative embodiment in which the Pulsating Heat Pipe circuit system is divided into two independent loops 6a and 6b: The first loop 6a is proximate to the thermo-conducting wall 20a, and the second loop 6b proximate to the thermo-conducting wall 20b. This arrangement is obtained by both connecting manifolds 30, 50 providing fluid passageways that separate a first group of tubes (for the first loop 6a) from a second group of tubes of the multitube element 10 (for the second loop 6b).

The arrangement of FIG. 5B is generally less preferred but might be beneficial if there are thermal differences, e.g., due to different operating temperatures on both sides of the cooling device, and when these thermal differences should not be balanced. Hence, this arrangement is particularly suited to a configuration in which thermally different power electronic devices (devices of different thermal loads) are used on the thermo-conducting walls 20a and 20b.

Heat Receiver Arrangement 20

Next, with reference to FIGS. 6A and 6B, further possible details of the heat receiver arrangement 20 are described.

FIG. 6A shows a configuration in which the metal block 22 of the heat receiver arrangement 20 is made of two pieces 22a, 22b directly contacting each other. This arrangement corresponds to that shown in FIG. 2C. In more detail, a first metal block 22a has the thermo-conducting wall 20a and thermally couples it to (is in direct contact with) a first portion of the multitube elements 10, and a second metal block 22b has the thermo-conducting wall 20b and thermally coupling it to a second portion of the multitube elements 10, so that there is essentially no remaining portion of the multitube elements 10 other than the first and second portions.

The arrangement allows a maximum heat transfer from the thermo-conducting walls 20a and 20b to the Pulsating Heat Pipe circuit system. In another embodiment, the metal block 22 can also be made of one piece having the same shape as the combination of pieces 22a, 22b, or of more than two pieces. The configuration of FIG. 6A can be combined with both of the loop structures illustrated in FIG. 5A and FIG. 5B.

FIG. 6B, on the other hand, shows a configuration in which the metal block 22 of the heat receiver arrangement 20 is made of two separate pieces 22a, 22b not contacting each other. Thereby, between the pieces 22a, 22b there remains a middle portion of the multitube elements 10 that is not thermally coupled to (in direct contact with) any one of the two pieces 22a, 22b.

The configuration of FIG. 6A may offer in some embodiments a more efficient heat transfer to the Pulsating Heat Pipe circuit system and is therefore generally preferred. However, the configuration of FIG. 6B may in some configurations reduce the heat transfer between the power electronic devices and can therefore offer advantages especially in combination of the embodiment of FIG. 5B.

Power Electronic Arrangement

FIG. 7 shows a power electronic arrangement 2 with the cooling device 1 described herein. Two power electronic devices to be cooled 4 are provided, one on each of the thermo-conducting walls 20a, 20b on opposite sides of the heat receiver arrangement 20, so that the power electronic devices 4 sandwich the cooling device 1 between them. Each of the power electronic devices 4 is thermally coupled to—and thereby during operation cooled by heat transfer through—the respective thermo-conducting wall 20a, 20b.

At least one of the power electronic devices 4 may be substituted by another device to be cooled, such as a dummy element or a functional element, e.g., an insulator providing the capability of having the stack in electrical parallel configuration. The power electronic devices, dummy element(s) and other functional element(s) are collectively referred herein as devices to be cooled. Whenever power electronic devices are mentioned in particular embodiments or aspects herein, it is understood that some of them may be substituted by such other devices, and that the term power electronic devices can thus be replaced by devices to be cooled.

Preferably, the devices to be cooled are power electronic devices, but they may also comprise a number of other devices such as the devices mentioned above. Preferably, at least 50% or even at least 80% of the devices to be cooled are power electronic devices. From another point of view, all but at most 1 or 2 of the devices to be cooled are power electronic devices.

FIG. 8 shows a power electronic arrangement 2 in which a plurality of power electronic devices 4 and cooling devices 1 are stacked in an alternating order. The middle ones of the power electronic devices 4 are thereby cooled by two cooling devices 1, one on each side of the respective power electronic device 4. Even more advantageously, an adequate cooling also of the outermost power electronic device 4 can be achieved by an alternative arrangement (not shown), wherein cooling devices 1 are provided at both ends of the alternating stack, so that all of the power electronic devices 4 are cooled by two cooling devices 1.

Even with that variation, only n+1 cooling devices 1 are needed for cooling n power electronic devices 4, instead of 2n devices according to a conventional design.

The power electronic arrangement 2 of FIGS. 7 and 8 can further comprise a clamping device pressing the alternating stack of the power electronic devices 4 and the cooling devices 1 against each other, thereby ensuring mechanical stability and a good thermal coupling between the power electronic devices 4 and the thermoconducting walls 20a, 20b.

According to a general aspect, the power electronic devices 4 may include power semiconductor devices such as IGCTs or IGBTs. The power electronic arrangement 2 described herein is particularly useful for power electronic devices 4 that are connected in series.

With the arrangement of FIGS. 7 and 8, only a reduced number of cooling devices 1 are needed for cooling a given number of power electronic devices 4. Thereby, a more compact arrangement is possible. Further, by using the cooling device 1 of FIG. 5A, thermal imbalances can be reduced. Alternatively, any other cooling device described herein can be used for the power electronic arrangements 2 of FIGS. 7 and 8.

The invention claimed is:

1. A cooling device for cooling at least two power electronic devices by a working fluid, the cooling device comprising:
   a Pulsating Heat Pipe circuit system having tubes of capillary dimension for the working fluid enabling the working fluid to perform thermo-fluidic transport by Pulsating Heat Pipe action;
   a heat receiver arrangement comprising
   a) a heat receiver portion of the Pulsating Heat Pipe circuit system and
   b) a pair of thermo-conducting walls provided on mutually opposite sides of the heat receiver arrangement and sandwiching the heat receiver portion between them, each of the thermo-conducting walls being adapted for receiving and for being thermally connected to a respective one of the power electronic devices, wherein the thermo-conducting walls are thermally coupled to the heat receiver portion such that in an operating state heat is transferred from the power electronic devices through the respective thermo-conducting walls to the heat receiver portion thereby heating the working fluid; and a heat dissipator arrangement comprising
a) a heat dissipator portion of the Pulsating Heat Pipe circuit system and
b) a plurality of fins thermally coupled to the heat dissipator portion for transferring heat from the heat dissipator portion to an external cooling fluid for cooling the working fluid in the heat dissipator portion, wherein the Pulsating Heat Pipe circuit system connects the heat receiver portion with the heat dissipator portion for transferring heat from the heat receiver portion to the heat dissipator portion by the Pulsating Heat Pipe action of the working fluid.

2. The cooling device according to claim 1, wherein the Pulsating Heat Pipe circuit system comprises
a plurality of multitube elements, each having multiple parallel straight capillary tubes;
a first connecting manifold at a first heat receiver portion side end of the multitube elements, the first connecting manifold having first connecting passages connecting respective first ends of the capillary tubes in a selective manner; and
a second connecting manifold at a second heat dissipator portion side end of the multitube elements, the second connecting manifold having second connecting passages connecting respective second ends of the capillary tubes in a selective manner.

3. The cooling device according to claim 2, wherein the Pulsating Heat Pipe circuit system comprises a common interconnected loop having a first loop section proximate to a first one of the pair of thermo-conducting walls, and a second loop section proximate to a second one of the pair of thermo-conducting walls, for reducing thermal imbalances between the pair of thermo-conducting walls.

4. The cooling device according to claim 3, wherein the Pulsating Heat Pipe circuit system comprises a first loop proximate to a first one of the pair of thermo-conducting walls, and a second loop proximate to a second one of the pair of thermo-conducting walls, the first and second loops being independent of each other.

5. The cooling device according to claim 4, wherein the heat receiver arrangement comprises a metal block having the pair of thermo-conducting walls provided on mutually opposite sides of the metal block and multiple openings accommodating the multitube elements, the metal block thermally coupling the pair of thermo-conducting walls to the multitube elements.

6. The cooling device according to claim 5, wherein the metal block is made of one piece or is made of several pieces directly contacting each other.

7. The cooling device according to claim 4, wherein the Pulsating Heat Pipe circuit system comprises a plurality of multitube elements, each having multiple parallel straight capillary tubes, and wherein
a first metal block having a first one of the pair of thermo-conducting walls and thermally coupling the first thermo-conducting wall to a respective portion of the multitube elements, and
a second metal block having a second one of the pair of thermo-conducting walls and thermally coupling the second thermo-conducting wall to a respective portion of the multitube elements.

8. The cooling device according to claim 1, wherein the Pulsating Heat Pipe circuit system comprises a common interconnected loop having a first loop section proximate to a first one of the pair of thermo-conducting walls, and a second loop section proximate to a second one of the pair of thermo-conducting walls, for reducing thermal imbalances between the pair of thermo-conducting walls.

9. The cooling device according to claim 1, wherein the Pulsating Heat Pipe circuit system comprises a first loop proximate to a first one of the pair of thermo-conducting walls, and a second loop proximate to a second one of the pair of thermo-conducting walls, the first and second loops being independent of each other.

10. The cooling device according to claim 1, wherein the Pulsating Heat Pipe circuit system comprises a plurality of multitube elements, each having multiple parallel straight capillary tubes, and wherein
the heat receiver arrangement comprises a metal block having the pair of thermo-conducting walls provided on mutually opposite sides of the metal block and multiple openings accommodating the multitube elements, the metal block thermally coupling the pair of thermo-conducting walls to the multitube elements.

11. The cooling device according to claim 10, wherein the metal block is made of one piece or is made of several pieces directly contacting each other.

12. The cooling device according to claim 1, wherein the Pulsating Heat Pipe circuit system comprises a plurality of multitube elements, each having multiple parallel straight capillary tubes, and wherein
a first metal block having a first one of the pair of thermo-conducting walls and thermally coupling the first thermo-conducting wall to a respective portion of the multitube elements, and
a second metal block having a second one of the pair of thermo-conducting walls and thermally coupling the second thermo-conducting wall to a respective portion of the multitube elements.

13. The cooling device according to claim 12, wherein the multitube elements are separate components from the first and second metal blocks, the multitube elements being disposed between the first and second metal blocks and being in contact therewith to thermally couple the multitube elements and the first and second metal blocks.

14. The cooling device according to claim 13, wherein the first and second metal blocks comprise a plurality of openings extending therethrough, one of the multitube elements extending through each of the openings.

15. The cooling device according to claim 14, wherein each of the openings is formed as one slit in the first metal block and another slit in the second metal block.

16. The cooling device according to claim 14, wherein the parallel straight capillary tubes of each multitube element are arranged side-by-side in a longitudinal row, a first cross-sectional dimension of each multitube element corresponding to a cross-sectional dimension of one of the parallel straight capillary tubes and a second cross-sectional dimension of each multitube element corresponding to a total number of the parallel straight capillary tubes in each multitube element, the second cross-sectional dimension thereby being greater than the first cross-sectional dimension.

17. The cooling device according to claim 1, wherein the Pulsating Heat Pipe circuit system comprises a first loop proximate to a first one of the pair of thermo-conducting walls, and a second loop proximate to a second one of the pair of thermo-conducting walls, the first and second loops being independent of each other; and wherein the Pulsating Heat Pipe circuit system comprises a plurality of multitube elements, each having multiple parallel straight capillary tubes, and wherein the heat receiver arrangement comprises a metal block having the pair of thermo-conducting walls provided on mutually opposite sides of the metal block and multiple openings accommodating the multitube elements, the metal block thermally coupling the pair of thermo-conducting walls to the multitube elements.

18. A power electronic arrangement comprising:
a cooling device including:
a Pulsating Heat Pipe circuit system having tubes of capillary dimension for a working fluid enabling the working fluid to perform thermo-fluidic transport by Pulsating Heat Pipe action;
a heat receiver arrangement comprising
a) a heat receiver portion of the Pulsating Heat Pipe circuit system and
b) a pair of thermo-conducting walls provided on mutually opposite sides of the heat receiver arrangement and sandwiching the heat receiver portion between them, each of the thermo-conducting walls being adapted for receiving and for being thermally connected to one of a respective power electronic device, wherein the thermo-conducting walls are thermally coupled to the heat receiver portion such that in an operating state heat is transferred from the power electronic devices through the respective thermo-conducting walls to the heat receiver portion thereby heating the working fluid; and
a heat dissipator arrangement comprising
a) a heat dissipator portion of the Pulsating Heat Pipe circuit system and
b) a plurality of fins thermally coupled to the heat dissipator portion for transferring heat from the heat dissipator portion to an external cooling fluid for cooling the working fluid in the heat dissipator portion, wherein
the Pulsating Heat Pipe circuit system connects the heat receiver portion with the heat dissipator portion for transferring heat from the heat receiver portion to the heat dissipator portion by the Pulsating Heat Pipe action of the working fluid; and
and at least two devices to be cooled, each being thermally coupled to a respective one of the thermo-conducting walls of the cooling device for cooling the respective device.

19. The power electronic arrangement according to claim 18, wherein at least half of the devices to be cooled are power electronic devices.

20. The power electronic arrangement according to claim 19, comprising a plurality of cooling devices, wherein the devices to be cooled and the cooling devices are stacked in an alternating order so that at least one of the devices to be cooled is thermally coupled to two thermo-conducting walls of adjacent cooling devices sandwiching the respective device to be cooled.

21. The power electronic arrangement according to claim 18, comprising a plurality of cooling devices, wherein the devices to be cooled and the cooling devices are stacked in an alternating order so that at least one of the devices to be cooled is thermally coupled to two thermo-conducting walls of adjacent cooling devices sandwiching the respective device to be cooled.

22. The power electronic arrangement according to claim 21, further comprising a clamping device pressing the alternating stack of the devices to be cooled and the cooling devices against each other.

23. A method for cooling at least two power electronic devices by a cooling device, the cooling device having a Pulsating Heat Pipe circuit system containing a working fluid and a pair of thermo-conducting walls, each of which is thermally connected to a respective one of the power electronic devices, the method comprising:
transferring heat from the power electronic devices through the respective one of the thermo-conducting walls to the working fluid being in a heat receiver portion of the Pulsating Heat Pipe circuit system, thereby heating the working fluid;
transporting heat of the working fluid from the heat receiver portion to a heat dissipator portion of the Pulsating Heat Pipe circuit system by Pulsating Heat Pipe action of the working fluid; and
transferring heat from the working fluid in the heat dissipator portion of the Pulsating Heat Pipe circuit system to an external cooling fluid.

* * * * *